United States Patent
Wang et al.

(10) Patent No.: US 10,804,495 B2
(45) Date of Patent: Oct. 13, 2020

(54) METHOD FOR ENCAPSULATING A DISPLAY PANEL, DISPLAY PANEL, AND DISPLAY DEVICE

(71) Applicant: BOE Technology Group Co., Ltd., Beijing (CN)

(72) Inventors: Tao Wang, Beijing (CN); Tao Sun, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/176,055

(22) Filed: Oct. 31, 2018

(65) Prior Publication Data

US 2019/0267572 A1    Aug. 29, 2019

(30) Foreign Application Priority Data

Feb. 26, 2018 (CN) .......................... 2018 1 0162056

(51) Int. Cl.
*H01L 51/52* (2006.01)
*H01L 51/56* (2006.01)

(52) U.S. Cl.
CPC ...... *H01L 51/5256* (2013.01); *H01L 51/5246* (2013.01); *H01L 51/56* (2013.01)

(58) Field of Classification Search
CPC .. H01L 51/5256; H01L 51/5246; H01L 51/56
See application file for complete search history.

(56) References Cited

U.S. PATENT DOCUMENTS

| 2012/0208306 A1 | 8/2012 | Haas et al. |
| 2014/0117316 A1* | 5/2014 | Choi ................ H01L 51/5253 257/40 |
| 2015/0001497 A1 | 1/2015 | Jung et al. |
| 2016/0118619 A1 | 4/2016 | Wang |
| 2016/0141550 A1 | 5/2016 | Fujino et al. |
| 2016/0343736 A1 | 11/2016 | Liu et al. |
| 2017/0040397 A1 | 2/2017 | Choe et al. |

FOREIGN PATENT DOCUMENTS

| CN | 103370806 A | 10/2013 |
| CN | 106711184 A | 5/2014 |
| CN | 104022233 A | 9/2014 |
| CN | 104253245 A | 12/2014 |
| CN | 104409652 A | 3/2015 |
| CN | 104900656 A | 9/2015 |
| CN | 106449696 A | 2/2017 |

OTHER PUBLICATIONS

Office Action for corresponding Chinese Application 201810162056.5 dated Apr. 30, 2019.

* cited by examiner

*Primary Examiner* — Matthew L Reames
(74) *Attorney, Agent, or Firm* — Arent Fox LLP; Michael Fainberg

(57) ABSTRACT

The disclosure discloses a method for encapsulating a display panel, a display panel, and a display device, and the method includes: providing a display panel body including an external circuit located in a non-display area; forming a protection layer covering at least a part of the external circuit; forming an encapsulation layer for encapsulating the display panel body; patterning the encapsulation layer; and removing the protection layer.

12 Claims, 7 Drawing Sheets

METHOD FOR ENCAPSULATING A DISPLAY PANEL, DISPLAY PANEL, AND DISPLAY DEVICE

CROSS-REFERENCE TO RELATED APPLICATION

This application claims priority to Chinese Patent Application No. 201810162056.5, filed on Feb. 26, 2018, the content of which is incorporated by reference in the entirety.

TECHNICAL FIELD

This disclosure relates to the field of display technologies, and particularly to a method for encapsulating a display panel, a display panel, and a display device.

DESCRIPTION OF THE RELATED ART

In the related art, an image can be displayed on a Liquid Crystal Display (LCD) panel or an Organic Light-Emitting Diode (OLED) display panel being bent; and various demands for new bendable terminal devices have emerged as flexible displays are light-weighted and easy to bend. Where when a flexible display product is being bent, a display element thereof may be bent or a control circuit area of the display element may be bent.

Further, it is easier to display an image on an OLED display fabricated on a flexible substrate while the OLED display is being bent at a small bending radius, since the OLED display can emit light by itself. Accordingly, wide attention has been paid to a fabrication of an OLED display panel including a flexible substrate. In the related art, it is common to encapsulate a flexible display via Thin Film Encapsulation (TFE), where encapsulation layers formed via thin film encapsulation include inorganic layers and organic layers, and the inorganic layers can block water vapor and oxygen; and since there is a significant stress on the inorganic layers, typically the organic layers or the like for releasing a stress and planarization are added between the inorganic layers.

SUMMARY

Embodiments of the disclosure provide a method for encapsulating a display panel, a display panel, and a display device.

In one aspect, the embodiments of the disclosure provide a method for encapsulating a display panel, the method including: providing a display panel body including an external circuit located in a non-display area; forming a protection layer covering at least a part of the external circuit; forming an encapsulation layer for encapsulating the display panel body, and patterning the encapsulation layer; and removing the protection layer.

In some embodiments, in the method above for encapsulating the display panel according to the embodiments of the disclosure, patterning the encapsulation layer includes: patterning the encapsulation layer so that orthographic projections of a resulting pattern of the encapsulation layer and a pattern of the protection layer onto the display panel body do not overlap with each other.

In some embodiments, in the method above for encapsulating the display panel according to the embodiments of the disclosure, the resulting pattern of the encapsulation layer is complementary to the pattern of the protection layer.

In some embodiments, in the method above for encapsulating the display panel according to the embodiments of the disclosure, the external circuit includes a bonding circuit; and forming the protection layer covering at least a part of the external circuit includes: forming a protection layer covering the bonding circuit.

In some embodiments, in the method above for encapsulating the display panel according to the embodiments of the disclosure, the external circuit includes a test circuit on which at least one insulation layer is arranged; and forming the protection layer covering at least a part of the external circuit includes: forming a protection layer covering at least a part of the at least one insulation layer.

In some embodiments, in the method above for encapsulating the display panel according to the embodiments of the disclosure, the external circuit includes a bonding circuit, and a test circuit on which at least one insulation layer is arranged; and forming the protection layer covering at least a part of the external circuit includes: forming a protection layer covering the bonding circuit and at least a part of the at least one insulation layer.

In some embodiments, in the method above for encapsulating the display panel according to the embodiments of the disclosure, patterning the encapsulation layer includes: forming a photoresist layer on the encapsulation layer; patterning the photoresist layer via a photolithographic process; etching the encapsulation layer to obtain a pattern of the encapsulation layer; and removing the photoresist layer.

In some embodiments, in the method above for encapsulating the display panel according to the embodiments of the disclosure, the photoresist layer is made of a low-temperature photoresist material.

In some embodiments, in the method above for encapsulating the display panel according to the embodiments of the disclosure, patterning the photoresist layer via the photolithographic process includes: patterning the photoresist layer via the photolithographic process so that orthographic projections of a resulting pattern of the photoresist layer and a pattern of the protection layer onto the display panel body do not overlap with each other.

In some embodiments, in the method above for encapsulating the display panel according to the embodiments of the disclosure, the resulting pattern of the photoresist layer is complementary to the pattern of the protection layer.

In some embodiments, in the method above for encapsulating the display panel according to the embodiments of the disclosure, a material of the protection layer includes photoresist; and removing the protection layer includes: removing the protection layer in a same process as removing the photoresist layer.

In some embodiments, in the method above for encapsulating the display panel according to the embodiments of the disclosure, a material of the protection layer includes ultraviolet-striping glue; and removing the protection layer includes: irradiating the protection layer with ultraviolet rays to strip the protection layer.

In some embodiments, in the method above for encapsulating the display panel according to the embodiments of the disclosure, a material of the protection layer includes thermal-stripping glue; and removing the protection layer includes: heating the protection layer to strip the protection layer.

In some embodiments, in the method above for encapsulating the display panel according to the embodiments of the disclosure, etching the encapsulation layer includes: etching the encapsulation layer via an inductively-coupled plasma process or a reactive ion etching process.

In some embodiments, in the method above for encapsulating the display panel according to the embodiments of the disclosure, forming the encapsulation layer for encapsulating the display panel body includes: forming at least two inorganic layers, and an organic layer located between two adjacent inorganic layers of the at least two inorganic layers.

In some embodiments, in the method above for encapsulating the display panel according to the embodiments of the disclosure, a pattern of the organic layer is sealed completely by the two adjacent inorganic layers.

In some embodiments, in the method above for encapsulating the display panel according to the embodiments of the disclosure, the display panel includes an organic light-emitting display panel, or a quantum dot light-emitting diode display panel.

In some embodiments, in the method above for encapsulating the display panel according to the embodiments of the disclosure, the display panel is the organic light-emitting display panel; and after the protection layer covering at least a part of the external circuit is formed, and before the encapsulation layer for encapsulating the display panel body is formed, the method further includes: forming an organic light-emitting layer in a display area of the display panel body via an vapor-deposition process.

In another aspect, the embodiment of the disclosure further provide a display panel, wherein the display panel is fabricated by using the method above for encapsulating the display panel according to the embodiments of the disclosure.

In still another aspect, the embodiment of the disclosure further provide a display device including the display panel above according to the embodiments of the disclosure.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In the related art, typically an inorganic layer is fabricated via Plasma Enhanced Chemical Vapor Deposition (PECVD), Magnetron Sputtering (SPUTTER), Atomic Layer Deposition (ALD), or another process, where the organic layer is commonly fabricated by depositing silicon nitride, silicon oxynitride, silicon oxide, or another inorganic layer at low temperature (below 90□) through PECVD. The inorganic layer is fabricated in reality in such a way that a metal mask is placed on a substrate to shield some functional area to thereby avoid traveling lines in the functional area from being damaged, and for example, a bonding area or a test area is shielded so that the inorganic layer will not be deposited in the area shielded by the metal mask.

Figure 1:
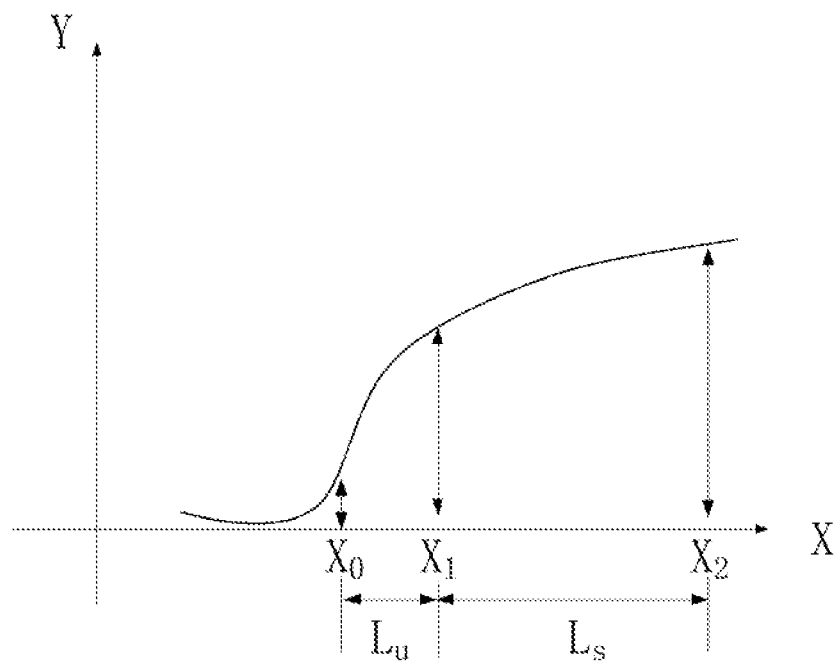
FIG. 1 is a schematic diagram of a distribution of a film thickness of an inorganic layer in the related art.

However when the functional area is shielded by the metal mask, the metal mask may not be placed on the substrate without any gap between them, so reaction gas may enter the gap between the metal mask and the substrate in the fabrication process so that a thin film is formed in the gap, thus resulting in an area with a non-uniform thickness, i.e., a Lu area as illustrated in FIG. 1, where X represents a distance from an edge of a display panel, and Y represents a film thickness of the inorganic layer; and moreover the reaction gas may be accumulated at a boundary of the metal mask, thus changing a proportion of the reaction gas, and a metal material in the metal mask may change a magnetic field, thus changing a distribution of plasma gas, so there may also be an area with a non-uniform film thickness at an edge of the metal mask, i.e., a Ls area as illustrated in FIG. 1. And since a capacity of an encapsulation layer to block water oxygen may be affected by a non-uniform thickness of the inorganic layer, in order to guarantee an encapsulation requirement of the encapsulation layer, a bezel shall be designed so that a range of the area with the non-uniform film thickness is extended into the bezel, thus discouraging the bezel from being designed narrow. Furthermore since a shape of the metal mask is irregular in an abnormally-shaped display panel, sizes of the Lu and Ls areas may be further increased.

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

It shall be appreciated that the following descriptions of some embodiments presented herein are merely intended to illustrate and describe, but not to limit the disclosure.

In view of the problem in the related art that the inorganic layer is fabricated using the metal mask so that the film thickness of the inorganic layer is not uniform, thus discouraging the bezel from being designed narrow, the embodiments of the disclosure provide a method for encapsulating a display panel, a display panel, and a display device.

Implementations of the method for encapsulating a display panel, the display panel, and the display device according to the embodiments of the disclosure will be described below in details with reference to the drawings. The thicknesses and shapes of respective layers in the drawings are not intended to reflect any real proportion, but only intended to illustrate the content of the disclosure.

Figure 2:
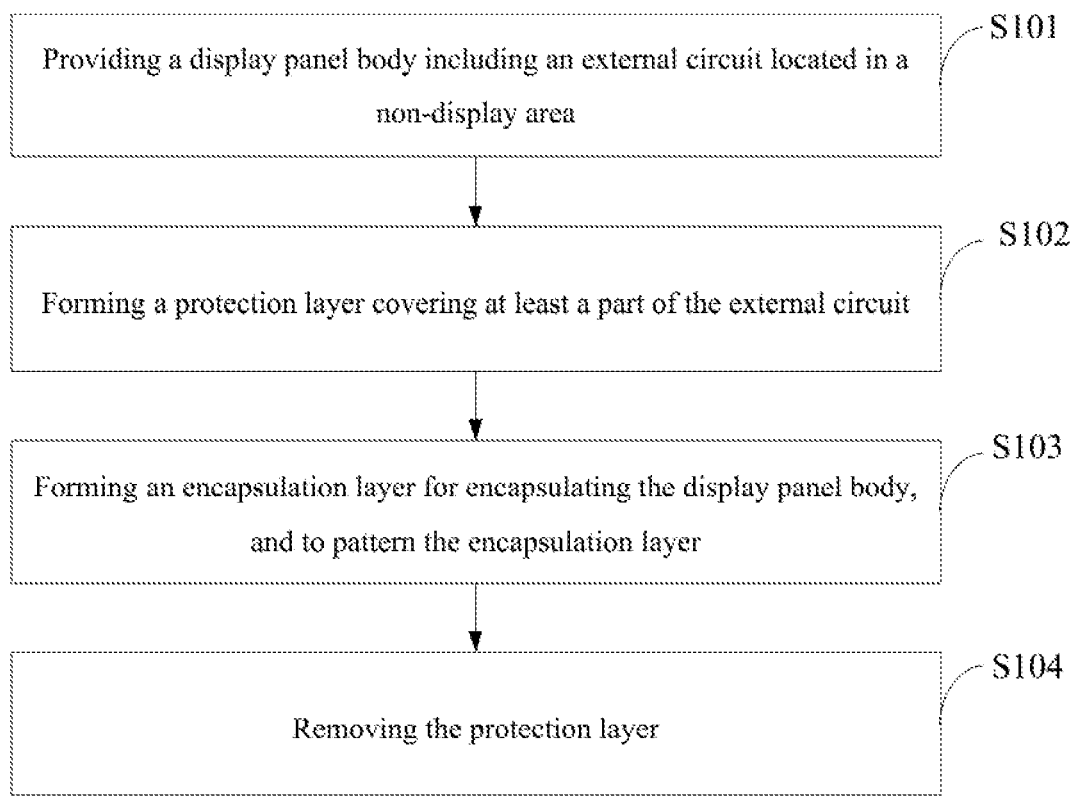
FIG. 2 is a first flow chart of a method for encapsulating a display panel according to the embodiments of the disclosure.

As illustrated in FIG. 2, the embodiments of the disclosure provide a method for encapsulating a display panel, where the method includes the following operations.

The operation S101 is to provide a display panel body including an external circuit located in a non-display area.

The operation S102 is to form a protection layer covering at least a part of the external circuit.

The operation S103 is to form an encapsulation layer for encapsulating the display panel body, and to pattern the encapsulation layer.

The operation S104 is to remove the protection layer.

In the method above for encapsulating the display panel according to the embodiments of the disclosure, firstly the protection layer is formed to cover at least a part of the external circuit before the encapsulation layer is formed, and the protection layer is removed after the encapsulation layer is formed, so that on one hand, a metal mask for shielding the external circuit can be avoided from being used, and on the other hand, the protection layer will not affect a fabrication of an inorganic layer, so a film thickness of the inorganic layer will not become non-uniform, so that a bezel can be designed without reserving any area where there may be a non-uniform film thickness, thus significantly reducing a size of the bezel and facilitating a design of a narrow bezel.

In some embodiments, the method above for encapsulating the display panel according to the embodiments of the disclosure can be applicable to any display panel fabricated via thin film encapsulation, e.g., an OLED display panel, or a Quantum Dot Light-Emitting Diode (QLED) display panel, etc., although the embodiments of the disclosure will not be limited thereto.

In some embodiments, in the operation S101 above, the display panel provided is an OLED display panel, or a QLED display panel, or another display panel, as needed in reality; and the display panel provided is a finished display panel or a display panel being fabricated, as needed in reality, although the embodiments of this disclosure will not be limited thereto. And it shall be noted that, the embodiments of the disclosure will be described by taking an OLED display panel as an example, and in order to make the method for encapsulating the display panel according to the embodiments of the disclosure more apparent, the drawings in the embodiments of the disclosure are only intended to illustrate the display panel in the non-display area.

In some embodiments, in the operation S102 above, the protection layer covering at least a part of the external circuit is formed, where the formed protection layer covers the entire external circuit, or covers only a part thereof where the signal traveling line(s) or the contact electrode(s) is (or are) arranged, as long as the signal line(s) in the external circuit can be protected. Thus in the subsequent operation S103, since the external circuit is covered by the protection layer, the signal line(s) in the external circuit will not be damaged while the encapsulation layer is being formed, a metal mask for shielding the external circuit can be avoided from being used, and the protection layer will not affect the fabrication of the inorganic layer in the encapsulation layer like the metal mask, so the uniformity of the inorganic layer can be improved, and a bezel area of the display panel can be designed without reserving an area where there may be a non-uniform film thickness, thus facilitating a design of a narrow bezel. Accordingly the method for encapsulating the display panel according to the embodiments of the disclosure is applicable to a process of fabricating a display panel with a narrow bezel, or an abnormally-shaped display panel. Furthermore the protection layer can be arranged also for planarization.

In some embodiments, in the method above for encapsulating the display panel according to the embodiments of the disclosure, patterning the encapsulation layer in the operation S103 above includes: patterning the encapsulation layer so that orthographic projections of a resulting pattern of the encapsulation layer and a pattern of the protection layer onto the display panel body do not overlap with each other.

Since the protection layer shall be formed before the encapsulation layer is formed, and further removed after the encapsulation layer is patterned, a pattern of the encapsulation layer is set to be non-overlapping with the pattern of the protection layer so that the protection layer can be removed more easily while guaranteeing an encapsulation function of the encapsulation layer. In some embodiments, if the protection layer can be removed, or a part of the pattern of the protection layer can be reserved without degrading the performance of the display panel, then the pattern of the encapsulation layer may alternatively be set to overlap with the pattern of the protection layer in some overlapping area, although the embodiments of the disclosure will not be limited to any pattern of the encapsulation layer.

In some embodiments, the pattern of the encapsulation layer is complementary to the pattern of the protection layer, so that the pattern of the encapsulation layer will not cover the pattern of the protection layer, and subsequently the protection layer can be removed conveniently; and the pattern of the encapsulation layer is set to be complementary to the pattern of the protection layer, so that a component on the display panel body will be covered by either the encapsulation layer or the protection layer, therefore each component on the display panel body can be protected. Further, it shall be noted that in the embodiments of the disclosure, the patterns of the encapsulation layer and the protection layer are complementary to each other in some deviation range, that is, there may be some distance between the encapsulation layer and the protection layer, and there may also be some deviation between their shapes.

Figure 4:
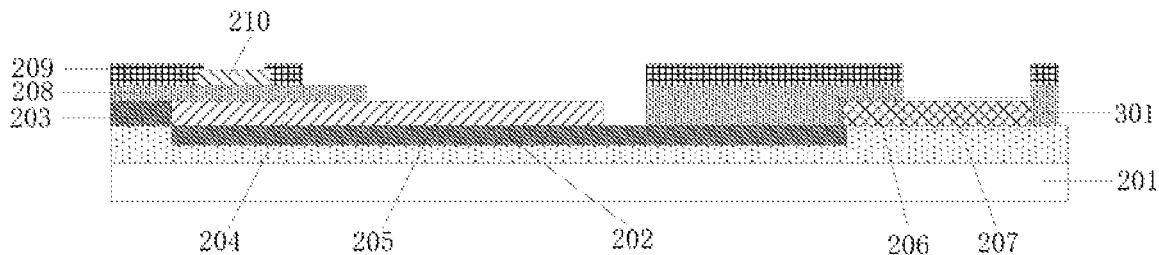
FIG. 4 is a schematic structural diagram of a display panel according to the embodiments of the disclosure.

In some embodiments, as illustrated in FIG. 4, the display panel body includes a fanout circuit 202 located on the base substrate 201, an Electro-Static Discharge (ESD) circuit 203, a high-level (VDD) signal line 204, a low-level (VSS) signal line 205, a planarization layer (PLN) 208, a Pixel Definition Layer (PDN) 209, an anode layer 210, etc. A display area of the display panel body shall be sealed by the subsequently formed encapsulation layer so that water vapor or oxygen can be prevented from intruding into the display area, which would otherwise have degraded a display effect.

In some embodiments, in the method above for encapsulating the display panel according to the embodiments of the disclosure, as illustrated in FIG. 4, the external circuit 301 includes a bonding circuit 207; and forming the protection layer covering at least a part of the external circuit in the operation S102 above includes: forming the protection layer covering the bonding circuit 207.

After the display panel is finished, the display panel can be connected with a circuitry from the outside via a contact electrode (pad) in the bonding circuit to thereby realize a display function of the display panel, so the bonding circuit cannot be sealed by the encapsulation layer, but may be protected by forming the protection layer in the operation S102.

In some embodiments, in the method above for encapsulating the display panel according to the embodiments of the disclosure, the external circuit above further includes a test circuit 206 on which at least one insulation layer is arranged; and forming the protection layer covering at least a part of the external circuit in the operation S102 above includes: forming the protection layer covering at least a part of the at least one insulation layer.

Since at least one insulation layer is arranged on the test circuit, the test circuit will not be damaged while the encapsulation layer is being formed, so the protection layer can be arranged to cover at least a part of the at least one insulation layer to thereby better protect the signal line(s) in the external circuit.

In some embodiments, as illustrated in FIG. 4, the external circuit 301 is arranged on the non-display area of the display panel body, and the external circuit 301 includes a test circuit 206, or a bonding circuit 207, or both, or includes another circuit to be connected with an element from the outside, although the embodiments of this disclosure will not be limited thereto. In a test stage of the display panel, the display panel can be connected with a test device from the outside via the test circuit 206 to test the display panel, and after the display panel is finished, the display panel can be connected with a circuitry from the outside via a contact electrode (pad) in the bonding circuit 207 to thereby realize a display function of the display panel, so the external circuit 301 located in the non-display area is not sealed by the encapsulation layer.

Figure 5A:
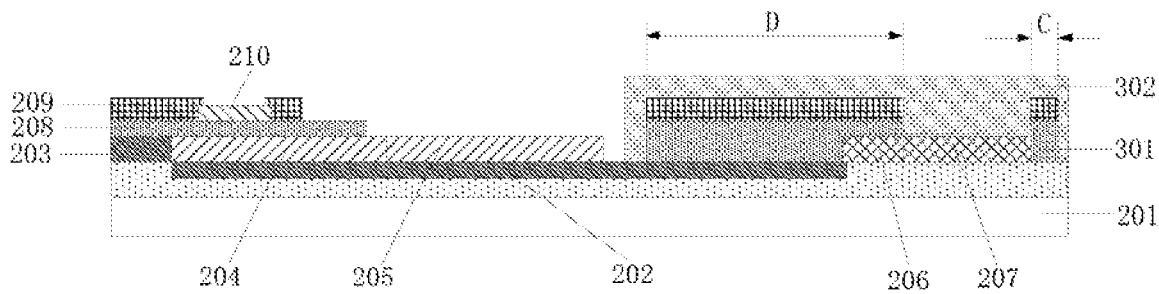
FIG. 5A to FIG. 5G are a set of schematic structural diagrams of a method for encapsulating a display panel according to the embodiments of the disclosure.
Figure 6A:
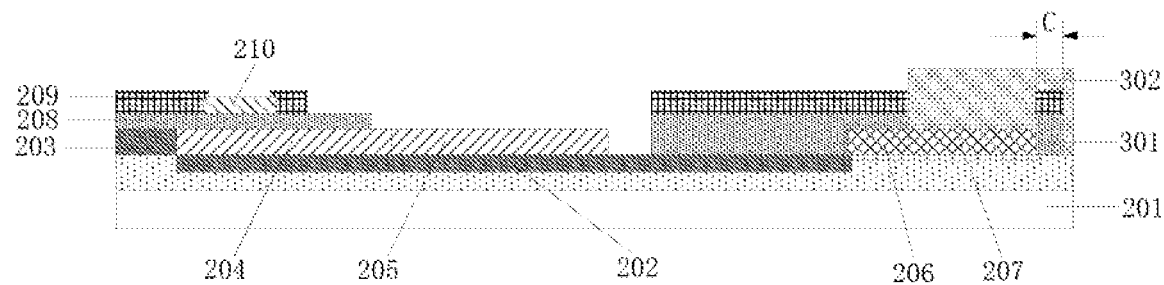
FIG. 6A to FIG. 6G are another set of schematic structural diagrams of a method for encapsulating a display panel according to the embodiments of the disclosure.

In some embodiments, in the operation S102 above, the protection layer is formed as long as it can cover the external circuit, where it can cover only the pattern of the external circuit, or can cover a part of a pattern of another layer in the non-display area. As illustrated in FIG. 5A, for example, the protection layer 302 covering the pattern of the external circuit 301 also covers parts of patterns of the planarization layer 208 and the pixel definition layer 209, i.e., an area C and an area D as illustrated in FIG. 5A. And as illustrated in FIG. 6A for example, the protection layer 302 covering the pattern of the external circuit 301 also covers parts of patterns of the planarization layer 208 and the pixel definition layer 209, i.e., an area C as illustrated in FIG. 6A. Further, the protection layer can alternatively cover only an exposed pattern of the external circuit. Here the protection layer will not be limited to any particular pattern as long as it can cover the external circuit.

Figure 3:
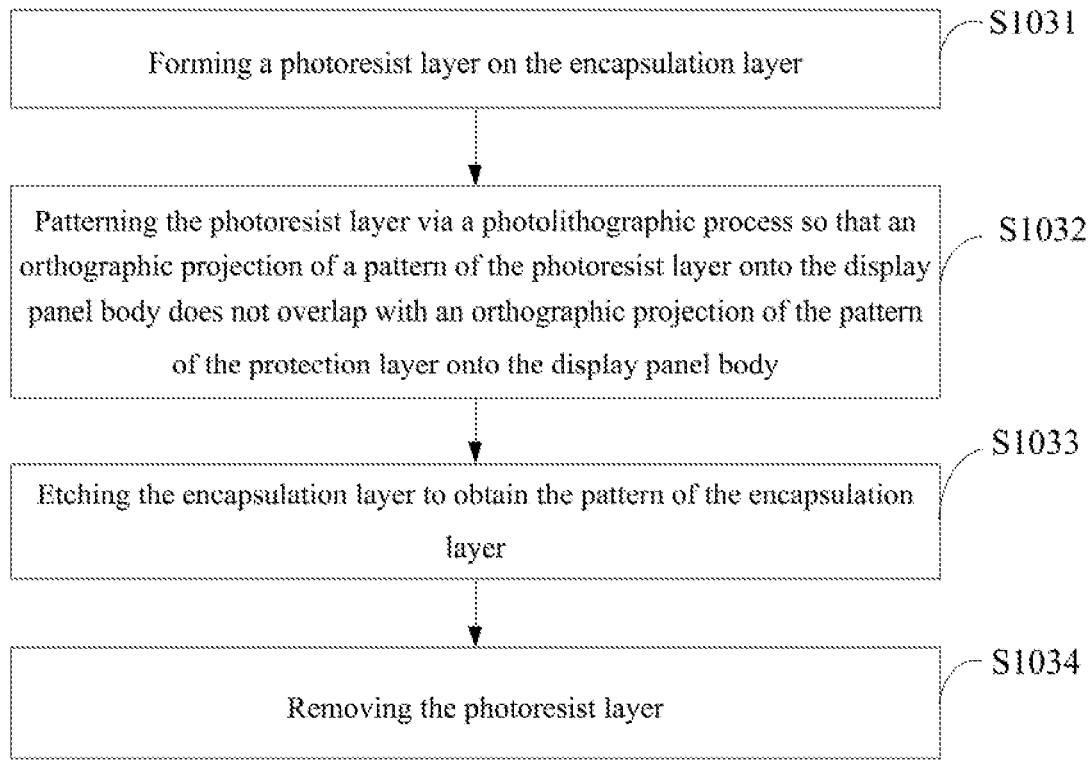
FIG. 3 is a second flow chart of a method for encapsulating a display panel according to the embodiments of the disclosure.

In some embodiments, in the method above for encapsulating the display panel according to the embodiments of the disclosure, patterning the encapsulation layer in the operation S103 includes the following operations as illustrated in FIG. 3.

Figure 5B:
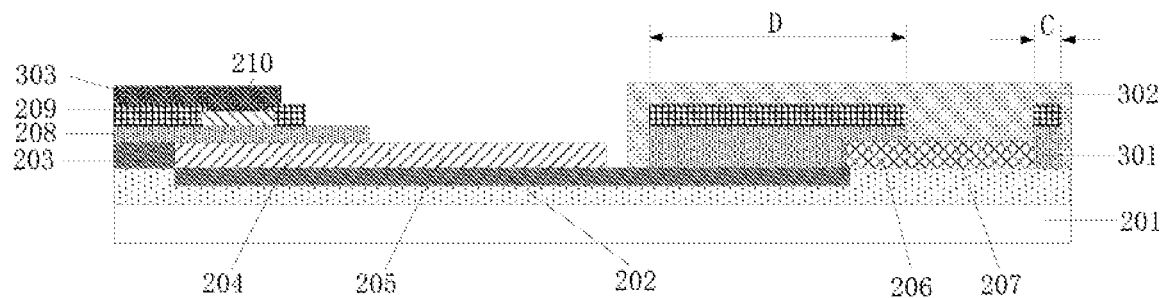
Figure 5C:
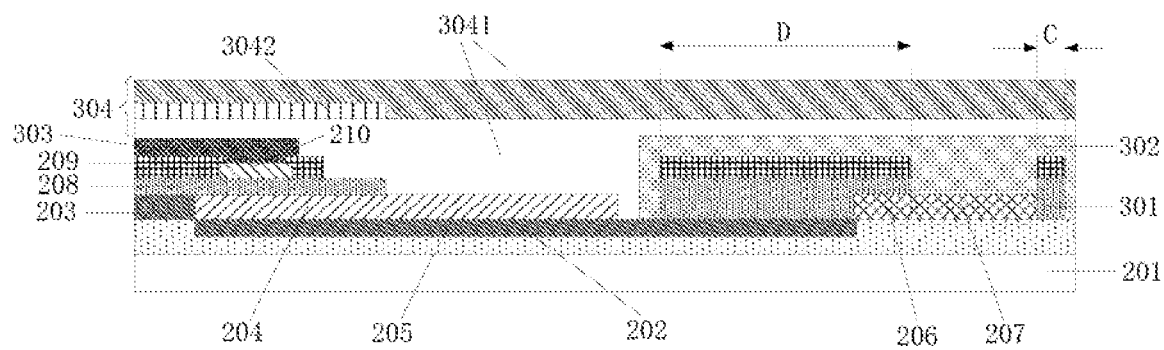
Figure 5D:
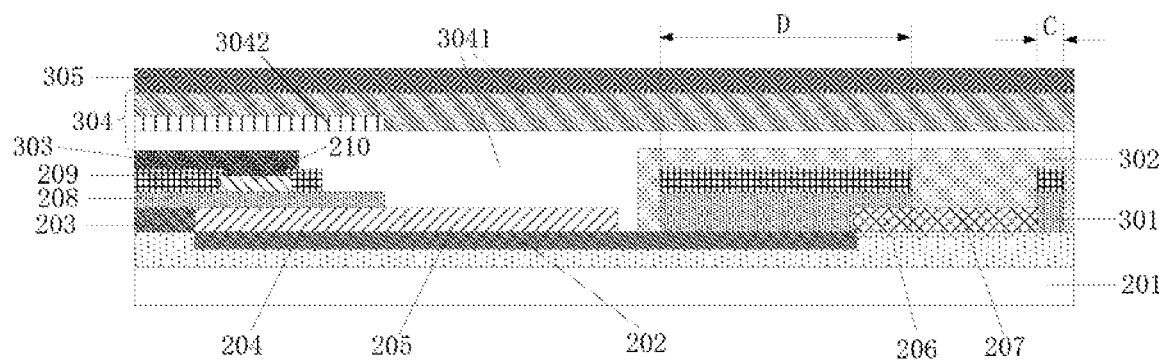
Figure 6B:
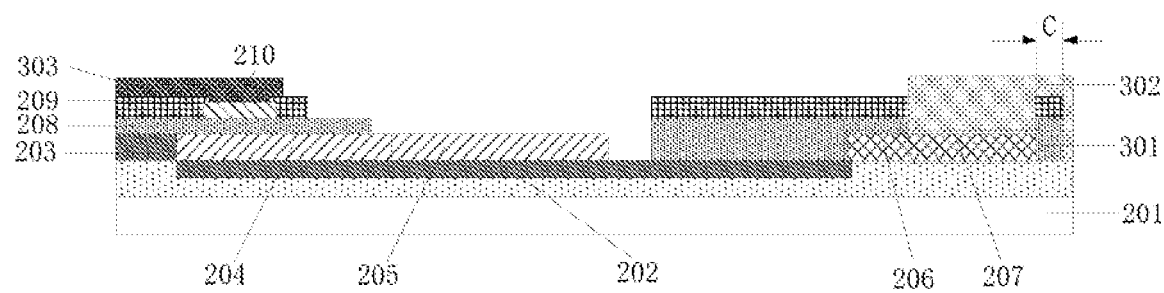
Figure 6C:
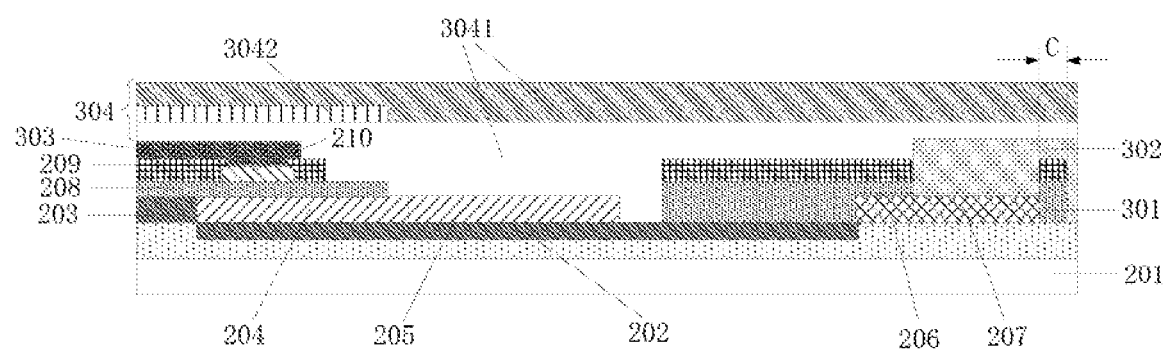
Figure 6D:
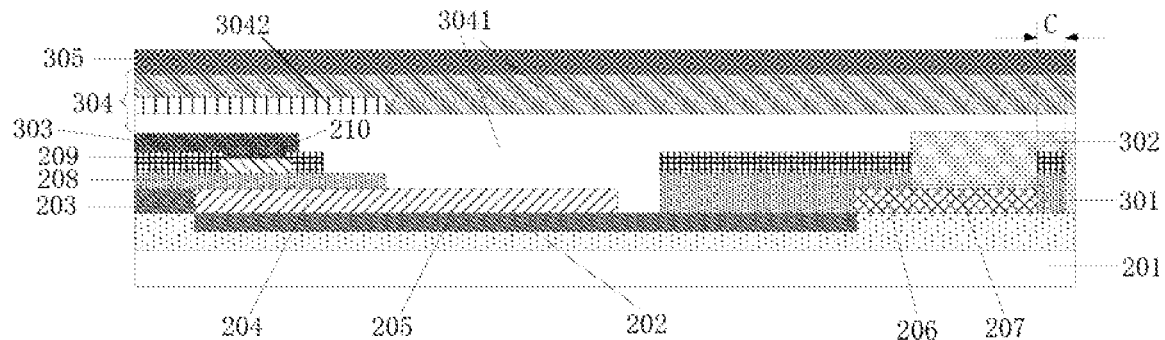

The operation S1031 is to form a photoresist layer 305 on the encapsulation layer 304 as illustrated in FIG. 5D and FIG. 6D. In some embodiments, the photoresist layer is formed by coating a Photo-Resist (PR) material, where positive or negative photoresist can be coated as needed in reality. Furthermore the photoresist layer is a low-temperature photoresist material, so a subsequent photolithographic process can be performed at low temperature without affecting the display panel.

Figure 5E:
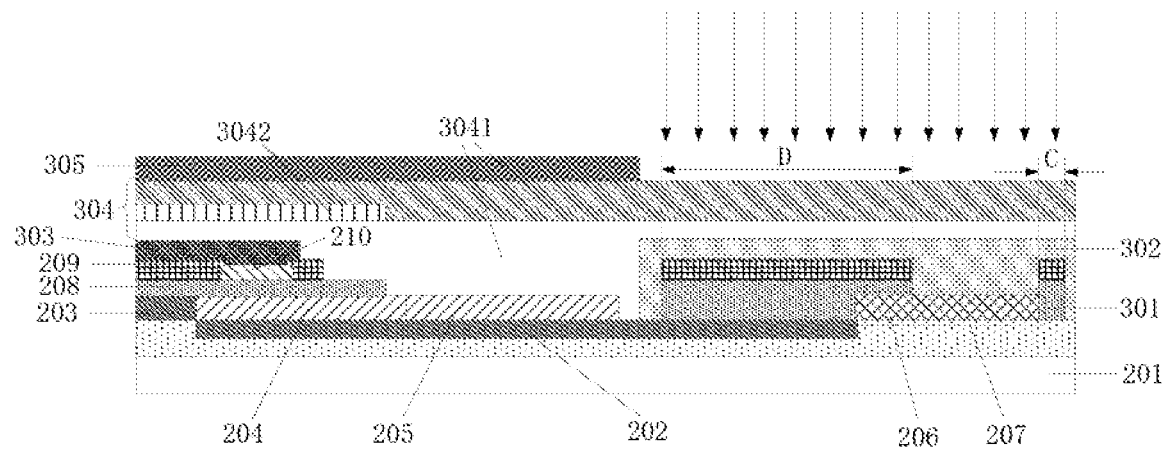
Figure 6E:
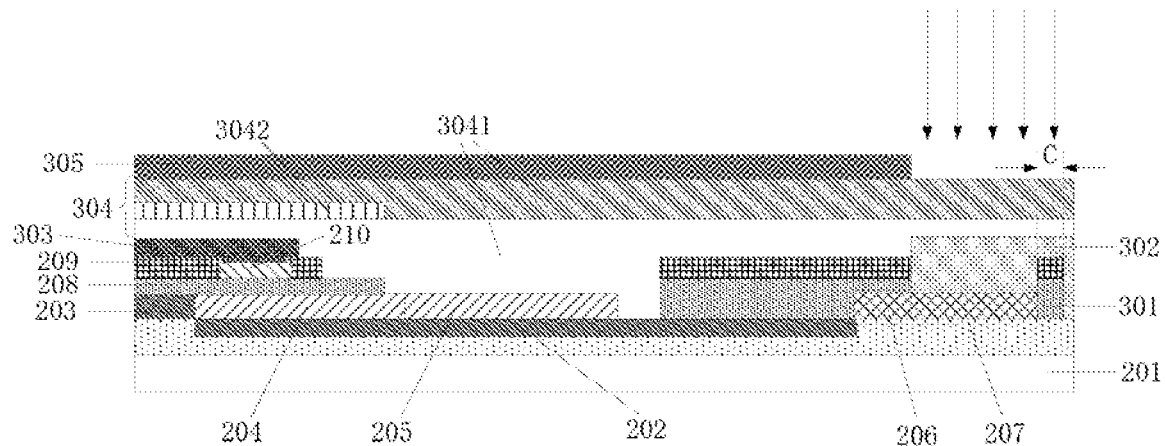

The operation S1032 is to pattern the photoresist layer 305 via a photolithographic process (i.e., exposure, development, and other processes). In some embodiments, an orthographic projection of a pattern of the photoresist layer 305 onto the display panel body is set to be non-overlapping with an orthographic projection of the pattern of the protection layer 302 onto the display panel body, that is, the pattern of the photoresist layer 305 does not cover the pattern of the protection layer 302, as illustrated in FIG. 5E and FIG. 6E, so that subsequently the protection layer can be removed completely. In some embodiments, the pattern of the photoresist layer 305 is complementary to the pattern of the protection layer 302, so the encapsulation layer 304 to be etched away can be exposed outside the photoresist layer 305, so that the pattern of the encapsulation layer 304, complementary to the pattern of the protection layer 302 can be formed.

Figure 5F:
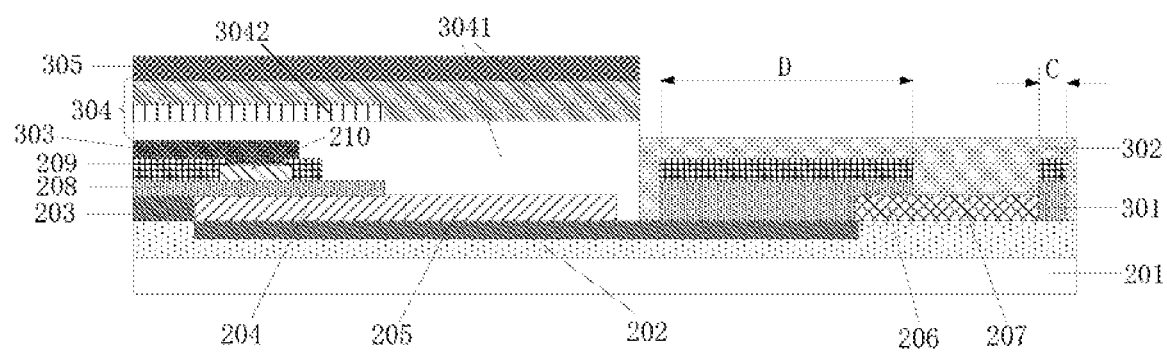
Figure 6F:
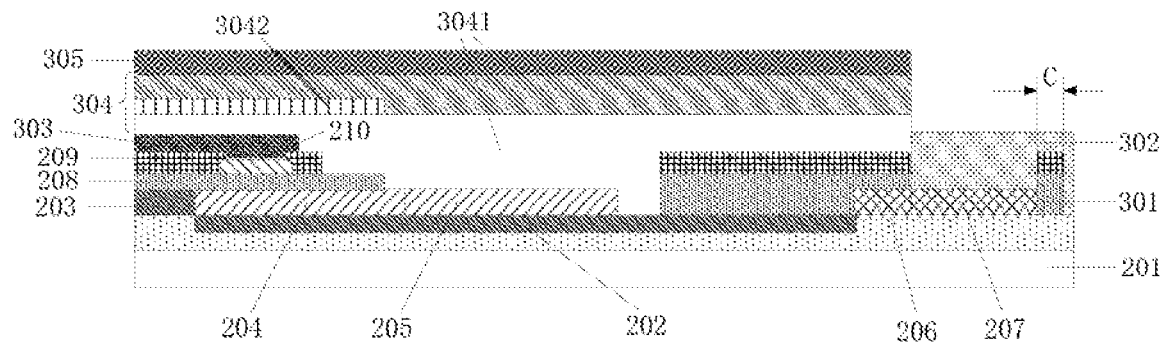

The operation S1033 is to etch the encapsulation layer 304 as illustrated in FIG. 5E and FIG. 6E; where an arrow represents etching of the encapsulation layer 304 and a resulting pattern of the encapsulation layer 304 is as illustrated in FIG. 5F and FIG. 6F.

Figure 5G:
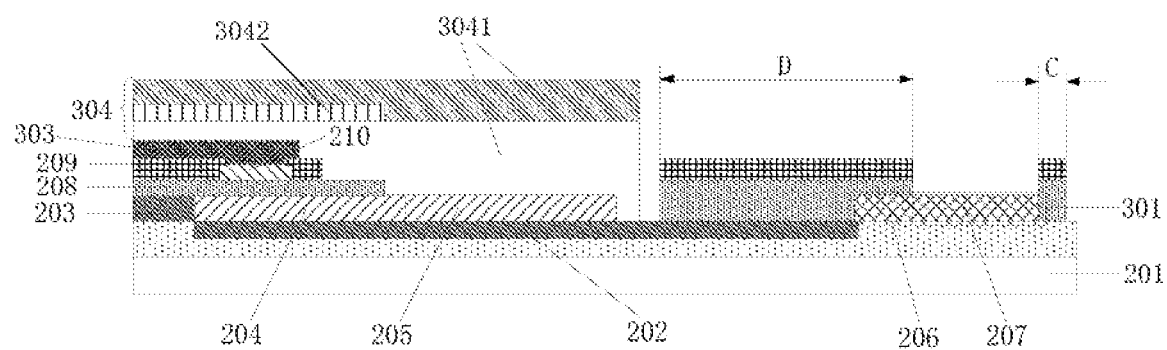
Figure 6G:
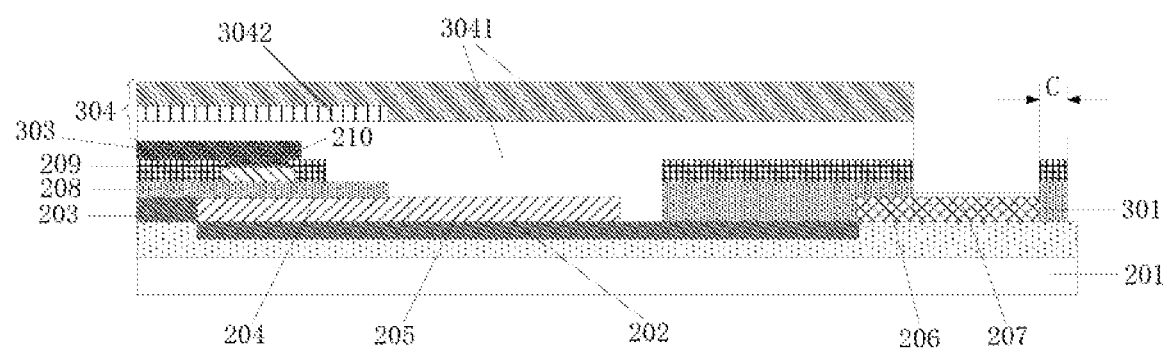

The operation S1034 is to remove the photoresist layer, thus resulting in a structure of the display panel as illustrated in FIG. 5G and FIG. 6G.

In some embodiments, in the method above for encapsulating the display panel according to the embodiments of the disclosure, the operation S104 above is performed in at least the following implementations.

In a first implementation, a material of the protection layer includes photoresist; and the operation S104 above includes the following operation: removing the protection layer in the same process as removing the photoresist layer.

Since the protection layer is also made of the photoresist material, the protection layer can be removed together with the photoresist layer to thereby reduce a process so as to lower a cost of fabricating the display panel.

In a second implementation, a material of the protection layer includes ultraviolet (UV)-striping glue; and the operation S104 above includes the following operation: irradiating the protection layer with UV rays to strip the protection layer.

The protection layer is fabricated using the UV-striping glue, and in the operation S104 above, the protection layer can be stripped from the display panel simply by irradiating the protection layer with UV rays, so the fabrication process can be performed easily.

In a third implementation, a material of the protection layer includes thermal-stripping glue; and the operation S104 above includes the following operation: heating the protection layer to strip the protection layer.

The protection layer is fabricated by using the thermal-stripping glue, and in the operation S104 above, the protection layer can be stripped from the display panel simply by heating the protection layer, so the fabrication process can be performed easily.

The first to third implementations above are exemplary implementations of the embodiments of the disclosure, and in some embodiments, the protection layer can alternatively be made of another material which can be stripped, that is, the protection layer can alternatively be removed otherwise, although the embodiments of the disclosure will not be limited to any particular material of the protection layer, or any particular method for removing the protection layer.

In the operation S104 above, the structure after the protection layer is removed is as illustrated in FIG. 5G or FIG. 6G and as can be apparent from the figure, the external circuit 301 is exposed after the protection layer is removed, so the protection layer can be set without affecting the structure and the function of the external circuit 301.

In some embodiments, in the method above for encapsulating the display panel according to the embodiments of the disclosure, etching the encapsulation layer in the operation S1033 above includes: etching the encapsulation layer via an Inductively-Coupled Plasma (ICP) process or a Reactive Ion Etching (ME) process. Both of the etching processes are low temperature dry-etching processes, and the etching processes can be performed at such temperature that will not affect the display panel.

As illustrated in FIG. 5E and FIG. 6E, while the encapsulation layer 304 is being etched, the external circuit 301 is covered by the protection layer 302, and etchant gas will not come into contact with any metal traveling-line in the external circuit 301 in the etching process, so no metal traveling-line in the external circuit 301 will be damaged in the etching process, thus avoiding a signal or current in the external circuit from being affected in the etching process.

In a practical application, in the method above for encapsulating the display panel according to the embodiments of the disclosure, forming the encapsulation layer for encapsulating the display panel body in the operation S103 above includes the following operation: forming at least two inorganic layers 3041, and an organic layer 3042 located between two adjacent inorganic layers 3041, as illustrated in FIG. 5C and FIG. 6C.

That is, the encapsulation layer includes inorganic and organic layers stacked over each other, where the inorganic layers block water vapor and oxygen, and the organic layer is located between two adjacent inorganic layers, and configured to alleviate a stress on the inorganic layers, and for planarization. As illustrated in FIG. 5C and FIG. 6C, the encapsulation layer 304 includes at least two inorganic layers 3041, and an organic layer 3042 arranged between two adjacent inorganic layers 3041; and a pattern of the organic layer 3042 is sealed completely by the two adjacent inorganic layers 3041 to thereby avoid water vapor and oxygen from intruding into the display panel through the organic layer 3042. As illustrated in FIG. 5C and FIG. 6C, the encapsulation layer 304 includes two inorganic layers 3041 and one organic layer 3042 by way of an example, but in a practical application, the encapsulation layer can include more inorganic and organic layers, although the embodiments of the disclosure will not be limited to any particular numbers of inorganic and organic layers.

In some embodiments, in the method above for encapsulating the display panel according to the embodiments of the disclosure, the inorganic layer is formed in the operation S103 above via a Chemical Vapor Deposition (such as Plasma Enhanced Chemical Vapor Deposition, PECVD) process, an Atomic Layer Deposition (ALD) process, or a Magnetron Sputtering (SPUTTER) process. The inorganic layer is made of silicon nitride, silicon oxynitride, silicon oxide, or another material. Since the external circuit is covered by the protection layer, the entire inorganic layer to be fabricated can be formed directly without any metal mask to be arranged to shield the external circuit, thus improving the uniformity of the inorganic layer.

In some embodiments, in the method above for encapsulating the display panel according to the embodiments of the disclosure, the organic layer is formed via a printing process, a screen printing process, or a chemical vapor deposition process in the operation S103 above.

In some embodiments, in the method above for encapsulating the display panel according to the embodiments of the disclosure, the display panel is an organic light-emitting display panel; and after the operation S102 above is performed, and before the operation S103 above is performed, the method further includes the following operation: forming an organic light-emitting layer (not illustrated) in a display area of the display panel body via an vapor-deposition process.

After the protection layer 302 is formed, and before the encapsulation layer 304 is formed, the display panel body can be vapor-deposited to thereby avoid the metal line(s) in the external circuit from being damaged in the vapor-deposition process. In a practical application, the organic light-emitting layer includes a plurality of organic layers, and after the organic light-emitting layer is formed, a cathode layer 303 is formed, as illustrated in FIG. 5B and FIG. 6B. Further, in order to simplify the display panel, the organic light-emitting layer is not illustrated in FIG. 5B and FIG. 6B, and in a practical application, the organic light-emitting layer is located between the anode layer 210 and the cathode layer 303.

Based upon the same inventive concept, the embodiments of the disclosure further provide a display panel which is fabricated by using the method for encapsulating the display panel above. Since the display panel addresses the problem under a similar principle to the method for encapsulating the display panel above, reference can be made to the implementation of the method above for an implementation of the display panel, and a repeated description thereof will be omitted here.

Based upon the same inventive concept, the embodiments of the disclosure further provide a display device including the display panel above, and the display device can be applicable to a mobile phone, a tablet computer, a TV set, a monitor, a notebook computer, a digital photo frame, a navigator, or any other product or component with a display function. Since the display device addresses the problem under a similar principle to the display panel above, reference can be made to the implementation of the display panel above for an implementation of the display device and a repeated description thereof will be omitted here.

In the method for encapsulating the display method, the display panel, and the display device according to the embodiments of the disclosure, firstly the protection layer is formed to cover at least a part of the external circuit before the encapsulation layer is formed, and the protection layer is removed after the encapsulation layer is formed, so that on one hand, a metal mask for shielding the external circuit can be avoided from being used, and on the other hand, the protection layer will not affect a fabrication of an inorganic layer, so the film thickness of the inorganic layer will not become non-uniform, so that a bezel can be designed without reserving any area where there may be a non-uniform film thickness, thus significantly reducing the size of the bezel and facilitating a design of a narrow bezel.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A method for encapsulating a display panel, comprising:
   providing a display panel body comprising a display area and a non-display area with an external circuit located in the non-display area;
   forming a protection layer covering at least a part of the external circuit;
   forming an encapsulation layer for encapsulating the display panel body, and patterning the encapsulation layer so that orthographic projections of a resulting pattern of the encapsulation layer and a pattern of the protection layer onto the display panel body do not overlap with each other; and
   removing the protection layer;
   wherein patterning the encapsulation layer comprises:
      forming a photoresist layer on the encapsulation layer;
      patterning the photoresist layer via a photolithographic process so that orthographic projections of a resulting pattern of the photoresist layer and a pattern of the protection layer onto the display panel body do not overlap with each other;

etching the encapsulation layer to obtain a pattern of the encapsulation layer; and removing the photoresist layer.

2. The method according to claim 1, wherein the external circuit comprises a bonding circuit; and forming the protection layer covering at least a part of the external circuit comprises:

forming a protection layer covering the bonding circuit.

3. The method according to claim 1, wherein the external circuit comprises a test circuit on which at least one insulation layer is arranged; and forming the protection layer covering at least a part of the external circuit comprises:

forming a protection layer covering at least a part of the at least one insulation layer.

4. The method according to claim 1, wherein the external circuit comprises a bonding circuit, and a test circuit on which at least one insulation layer is arranged; and forming the protection layer covering at least a part of the external circuit comprises:

forming a protection layer covering the bonding circuit and at least a part of the at least one insulation layer.

5. The method according to claim 1, wherein the resulting pattern of the photoresist layer is complementary to the pattern of the protection layer.

6. The method according to claim 1, wherein a material of the protection layer comprises photoresist; and removing the protection layer comprises:

removing the protection layer in a same process as removing the photoresist layer.

7. The method according to claim 1, wherein a material of the protection layer comprises ultraviolet-striping glue; and removing the protection layer comprises:

irradiating the protection layer with ultraviolet rays to strip the protection layer.

8. The method according to claim 1, wherein a material of the protection layer comprises thermal-stripping glue; and removing the protection layer comprises:

heating the protection layer to strip the protection layer.

9. The method according to claim 1, wherein etching the encapsulation layer comprises:

etching the encapsulation layer via an inductively-coupled plasma process or a reactive ion etching process.

10. The method according to claim 1, wherein forming the encapsulation layer for encapsulating the display panel body comprises:

forming at least two inorganic layers, and an organic layer located between two adjacent inorganic layers of the at least two inorganic layers.

11. The method according to claim 10, wherein a pattern of the organic layer is sealed completely by the two adjacent inorganic layers.

12. The method according to claim 1, wherein the display panel is an organic light-emitting display panel; and after the protection layer covering at least a part of the external circuit is formed, and before the encapsulation layer for encapsulating the display panel body is formed, the method further comprises:

forming an organic light-emitting layer in a display area of the display panel body via an vapor-deposition process.

* * * * *